(12) United States Patent
Furuya

(10) Patent No.: US 7,046,200 B2
(45) Date of Patent: May 16, 2006

(54) SURFACE-MOUNTED ANTENNA APPARATUS

(75) Inventor: Masahiro Furuya, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 93 days.

(21) Appl. No.: 10/816,883

(22) Filed: Apr. 5, 2004

(65) Prior Publication Data

US 2005/0007281 A1    Jan. 13, 2005

(30) Foreign Application Priority Data

Jul. 11, 2003    (JP) .............................. 2003-196163

(51) Int. Cl.
*H01Q 1/38*    (2006.01)
(52) U.S. Cl. ............................... 343/700 MS; 343/873
(58) Field of Classification Search ......... 343/700 MS, 343/702, 873, 895
See application file for complete search history.

(56) References Cited

U.S. PATENT DOCUMENTS

| 6,040,806 A * | 3/2000 | Kushihi et al. ............. 343/853 |
| 6,614,398 B1 * | 9/2003 | Kushihi et al. ...... 343/700 MS |
| 6,639,559 B1 * | 10/2003 | Okabe et al. ........ 343/700 MS |

OTHER PUBLICATIONS

Jason Patrick Affourtit et al, "Multiple Assay based on PCR for Haplotype Determination", JAPIO abstract of JP2002-272482, 2002.

* cited by examiner

*Primary Examiner*—Shih-Chao Chen
(74) *Attorney, Agent, or Firm*—Browdy and Neimark, PLLC

(57) ABSTRACT

In a surface-mounted antenna apparatus which is surface-mounted on a circuit substrate, condenser connecting electrodes for connecting leads of a coil and a synchronous chip condenser are disposed on an upper surface of one flange provided in the surface-mounted antenna apparatus, and circuit connecting electrodes for connecting with a receiving circuit provided on the circuit substrate are disposed on a lower surface of the one flange.

14 Claims, 11 Drawing Sheets

SURFACE-MOUNTED ANTENNA APPARATUS

BACKGROUND OF THE INVENTION

1. Field of the Invention

The present invention relates to a surface-mounted antenna apparatus, more specifically, to a small and inexpensive surface-mounted antenna apparatus, which is adapted to be effectively used in electronic devices such as a television, a radio, or a wave clock for receiving radio waves.

2. Description of the Prior Art

Generally, an antenna apparatus to receive radio waves of ground digital waves or the like is required in a television, a radio and so on. An antenna apparatus to receive standard radio waves for correcting automatically a time is also used in a wave clock.

In recent, such a wave clock is used in a time piece such as a wrist watch, a clock, as well as, a various of information devices such as a mobile phone, a car navigation, a personal computer, a PDA (Personal Digital Assistant) or the like, to indicate an accurate time constantly.

The antenna apparatus used in these television, radio, wave clock, mobile phone or the like has been mainly formed into a surface-mounted type which is surface-mounted on a circuit substrate disposed within the information device or the like, because the television, the information device and so on have been miniaturized, in particular, thinned.

However, if the information device or the like is thinned, parts and so on, constituting the antenna apparatus must be distributed individually on a two-dimensional surface of the circuit substrate, even if the antenna apparatus can be thinned, there is a problem that considerable time and effort are taken in assembling the parts such as a work for connecting the parts and therefore it becomes expensive.

Accordingly, it is required to make a surface-mounted antenna apparatus, which can be thinned as a whole, is inexpensive, and is easy to assemble parts.

A typical example of a conventional surface-mounted antenna apparatus applied to a wave clock is illustrated in FIGS. 10 and 11.

The antenna apparatus 1 includes an antenna body 9, a synchronous chip condenser 2 constituting a receiving circuit or resonant circuit for receiving radio waves in association with the antenna body 9, a crystal oscillator 3 for generating a clock signal with a predetermined frequency, an IC 4 constituting a clock for forming times by the clock signal from the crystal oscillator 3 and condensers 5 and 6 for the IC 4, as shown in FIGS. 10 and 11.

In addition, the IC 4 drives the crystal oscillator 3 and the receiving circuit for receiving the radio waves and comprising the antenna body 9 and the synchronous chip condenser 2 by means of a power applied from a battery 7, corrects the times of the clock by standard radio waves received from the receiving circuit and outputs a clock signal 8 of the corrected times (see FIG. 10).

The antenna body 9 is provided with a bar-like ferrite core (not shown) for receiving the standard radio waves, and a coil 10 is wound on an outer periphery of the core (see FIG. 10). Flanges 11 and 12 are provided on opposite ends of the antenna body 9. Leads 13 and 14 of the coil 10 are directly connected with a circuit pattern 16 formed on a circuit substrate 15 in an information device, or connected through coil connecting electrodes (not shown) disposed on the flange 11 or 12 with the circuit pattern 16, as shown in FIG. 11.

Moreover, the parts such as the synchronous chip condenser 2, the crystal oscillator 3, the IC 4, the condensers 5 and 6 and so on are mounted on the circuit pattern 16 formed on the circuit substrate 15 so that a clock device is generally formed, which corrects automatically the time of electronic devices by receiving the standard radio waves and then outputs the clock signal for the corrected times (see FIG. 10).

However, because the circuit substrate 15 is provided with the circuit pattern 16 for connecting the antenna body 9, the chip condenser 2, the crystal oscillator 3, the IC 4 and so on, a space is required to form the circuit pattern 16 on the circuit substrate 15, in the conventional antenna apparatus 1 as shown in FIG. 11. In addition, at least antenna body 9 and the chip condenser 2 must be separately mounted at any position on the circuit pattern 16.

Further, a check about whether or not the receiving circuit comprising the surface-mounted antenna body 9 and the chip condenser 2 synchronizes completely with a frequency of the standard radio waves to be received cannot be performed before the completion of assembly at which the various parts such as the crystal oscillator 3 and so on have been mounted on the circuit pattern. Consequently, it takes a considerable time for carrying out the checking, the other hand, if there is a defective product on the antenna apparatus 1, time and effort are required for disassembly of the parts, re-assembly thereof and adjustment of the parts.

Moreover, in the antenna apparatus 1 as described above, because the antenna body 9 having the bar-like ferrite core is used, the antenna body 9 has a high directivity and therefore if the antenna apparatus 1 is used in a small mobile information device for communicating information at any places, sensibility of the antenna apparatus 1 largely varies in the use of only one antenna body 9, because directions of communicating information in the antenna apparatus 1 vary pursuant to a posture of the antenna body 9. As a method avoiding the variation in the sensibility of the antenna apparatus, it is known to receive radio waves or a signal by arranging to be approximately perpendicular two antenna bodies to form a more-high sensitive antenna apparatus (for example, Japanese Patent Laid-Open 2002-272482).

However, as described above, when the two antenna bodies are arranged perpendicularly and used, although the variation in the sensibility of the antenna bodies can be prevented, the antenna apparatus becomes more expensive, because the antenna bodies and the condensers for consisting the receiving circuit in synchronization with the antenna bodies must be disposed at least two by two, a wide space is required to dispose the plurality of antenna bodies and the condensers, ant therefore it is not avoided that the information device becomes a large size.

SUMMARY OF THE INVENTION

The present invention is made to solve the aforementioned problems in the prior art, and it is, therefore, an object of the present invention to provide a surface-mounted antenna apparatus in which the miniaturization can be accomplished, the assembly is more easy and inexpensive, and a performance of the parts can be checked before the completion of assembly.

To attain the above object, a surface-mounted antenna apparatus according to a first aspect of the present invention is surface-mounted on a circuit substrate having a circuit pattern, and comprises a receiving or transmitting circuit provided on a circuit substrate and at least one antenna body which is surface-mounted on the circuit substrate.

At least one portion of the receiving parts in the receiving circuit and connecting electrodes for connecting the one portion of the receiving parts with the receiving circuit are installed on the antenna body.

A surface-mounted antenna apparatus according to a second aspect of the present invention comprises a base, a plurality of antenna bodies extending in a plurality of directions from the base, a circuit for receiving the radio waves, formed on an upper surface of the base, and electrodes provided on a lower surface of the base to be connected with the receiving circuit and the circuit substrate.

DETAILED DESCRIPTION OF THE PREFERRED EMBODIMENTS

Several embodiments of the present invention will be explained with reference to the accompanying drawings below.

It should be noted in the following embodiments that although a surface-mounted antenna apparatus according to the present invention is, in particular, applied to a wave clock, the present invention is not limited to these embodiments, for example, may be applied to a television, a radio, a mobile phone, other devices for receiving radio waves and so on. Also, the present invention may be applied to a surface-mounted antenna apparatus for transmitting the radio waves, without being limited only to a surface-mounted antenna apparatus for receiving the radio waves.

Figure 1:
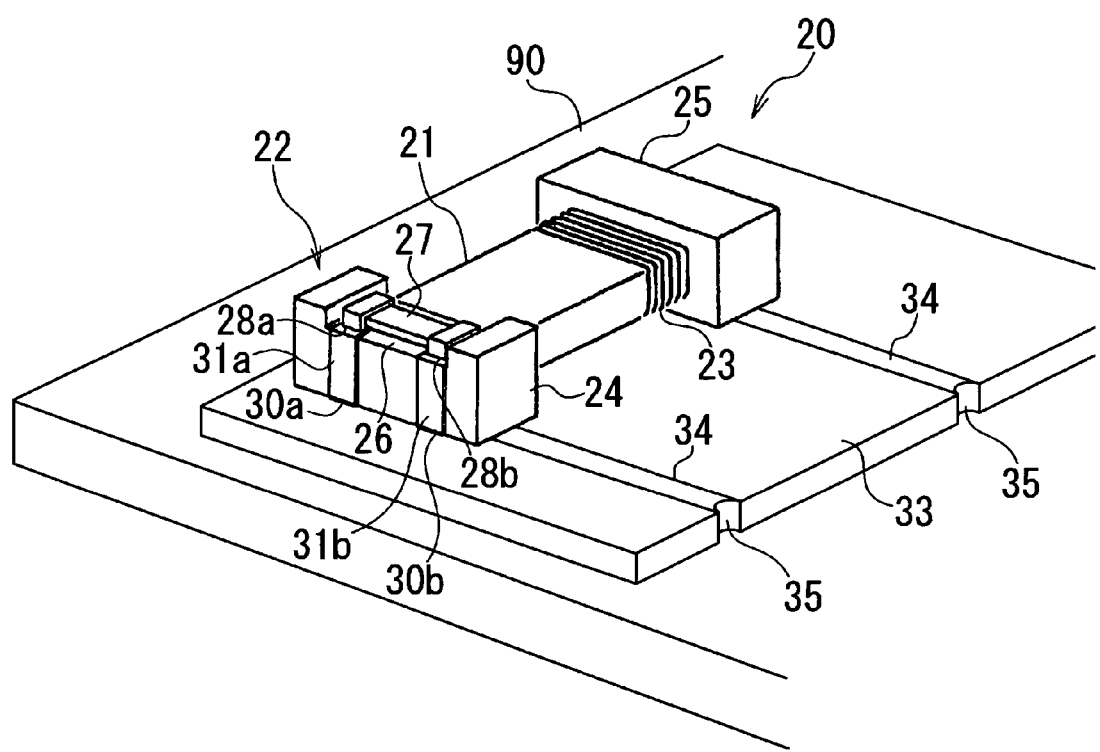
FIG. 1 is a perspective view showing one embodiment of a surface-mounted antenna apparatus for receiving the standard frequency transmission, according to the present invention.
Figure 2:
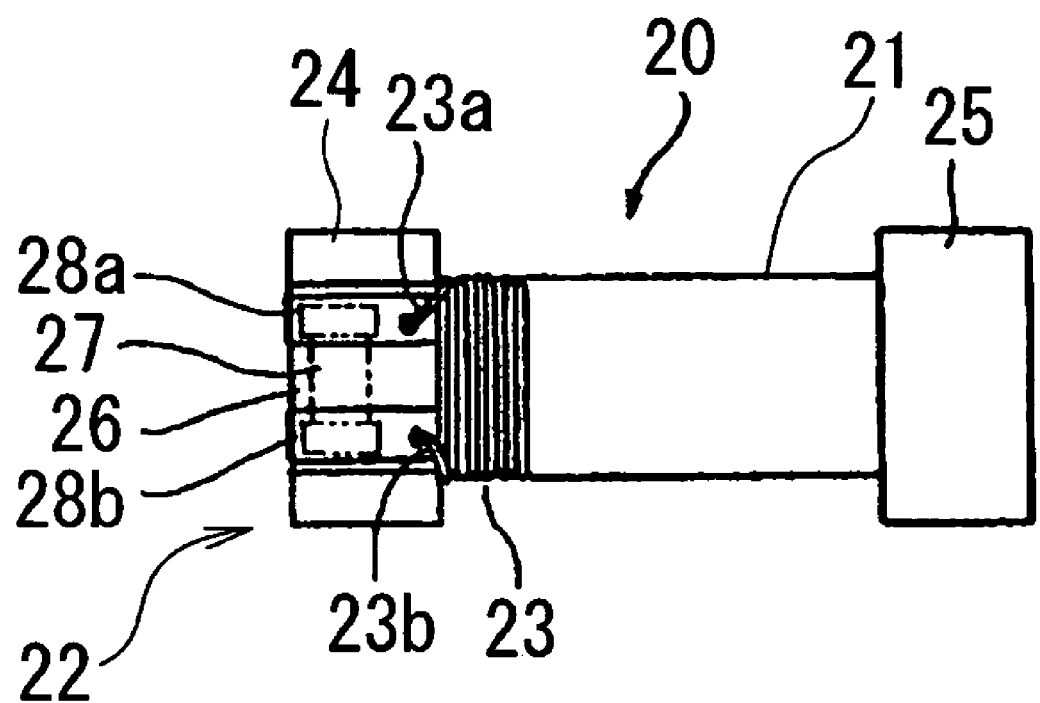
FIG. 2 is a top view of the surface-mounted antenna apparatus as shown in FIG. 1.
Figure 3:
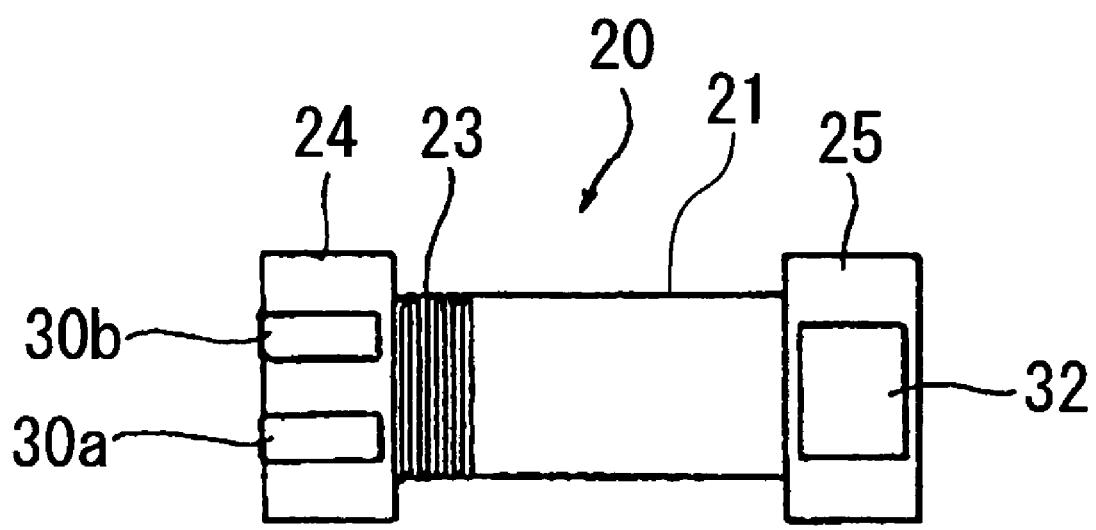
FIG. 3 is a bottom view of the surface-mounted antenna apparatus as shown in FIG. 1.

A first embodiment of the surface-mounted antenna apparatus for receiving or transmitting the radio waves according to the present invention is illustrated in FIGS. 1 to 3. The surface-mounted antenna apparatus 20 illustrated in the first embodiment comprises at least one antenna body 21 and a receiving circuit 22 for receiving the radio waves in cooperation with the antenna body 21. The antenna body 21 has preferably an elongated flat shape. The receiving circuit 22 is installed on a circuit substrate 33.

One or more parts of the receiving circuit are installed in the antenna body 21. For example, within the antenna body 21 is disposed a core (not shown), on an outer periphery of which is disposed a coil 23 wound in a predetermined winding number. An antenna assembly is thus formed from the antenna body 21, the core and the coil 23.

For example, at least one end of the antenna body 21 is provided with a flange 24 for mounting thereon a portion of parts of the receiving circuit 22. A pair of flanges 24 and 25 is provided on both ends of the antenna body 21 in the embodiment.

The one or the pair of flanges functions as a supporter to the core. An upper surface 24a of one flange 24, for example, of the flanges 24 and 25 is formed with a concave portion 26 in which a synchronous chip condenser 27 (illustrated by imaginary lines in FIG. 2) of the receiving or transmitting circuit 22 and for example, two separated rectangular condenser connecting electrodes 28a and 28b are inserted (see FIG. 1).

More specifically, as shown in FIGS. 1 and 2, the condenser connecting electrodes 28a and 28b are attached on a bottom surface of the concave portion 26 and the chip condenser 27 is disposed in an electrically connected state with upper surfaces of the condenser connecting electrodes 28a and 28b (see FIG. 2). The condenser connecting electrodes act to connect electrically the antenna body 21 and receiving circuit 22.

Terminal leads 23a and 23b of the coil 23 are connected with the condenser connecting electrodes 28a and 28b, as shown in FIG. 2.

Here, it should be noted that a depth of the concave portion 26 is larger than that of the chip condenser 27, and therefore when the chip condenser 27 is contained in the concave portion 26, an upper surface of the chip condenser 27 is adapted not to be projected from the concave portion 26.

A lower surface of the flange 24 is provided with, for example, two separated circuit connecting electrodes 30a and 30b (see FIG. 3). The circuit connecting electrodes 30a and 30b are connected electrically with the condenser connecting electrodes 28a and 28b, respectively.

In this case, the condenser and circuit connecting electrodes 28a, 28b and 30a, 30b are formed from an integral electrode pieces having condenser connecting electrodes 28a and 28b, intermediate electrodes 31a and 31b (see FIG. 1) extending from the condenser connecting electrodes and arranged on a side surface of the flange 24 and the circuit connecting electrodes 30a and 30b (see FIG. 3) extending from the intermediate electrodes and arranged on the lower surface of the flange 24, in the embodiment.

A dummy electrode 32 is disposed independently of the circuit connecting electrodes 30a and 30b on a lower surface of the other flange 25 in the antenna body 21, as shown in FIG. 3. The dummy electrode 32 is connected with a circuit pattern 34 provided on the circuit substrate 33, as well as the circuit connecting electrodes 30a and 30b. In addition, the circuit pattern 34 is conducted to a circuit pattern (not shown) provided on a back surface of the circuit substrate 33 or on a mother board 90 (see FIG. 1).

In this way, the antenna assembly 20 is mounted easily on the circuit substrate 33. Here, the condenser connecting electrodes 28a and 28b, the intermediate electrodes 31a and 31b, the circuit connecting electrodes 30a and 30b, and the dummy electrode 32 are formed on surfaces of the flanges 24 and 25 by any means such as printing or evaporating. In this case, these electrodes are preferably made of an alloy of silver palladium, or the like.

Because the surface-mounted antenna apparatus 20 for receiving the radio waves or standard radio waves in the embodiment is configured as described above, a receiving circuit for receiving the standard radio waves can be configured with only one surface-mounted antenna apparatus 20 in which the antenna assembly 21 and the chip condenser 27 are integrally formed. Consequently, the surface-mounted antenna apparatus 20 can be used as the receiving circuit for receiving the standard radio waves only by mounting the apparatus on the circuit pattern 34 of the circuit substrate 33 in position.

Therefore, in the present invention, it is not necessary to connect individually the surface-mounted antenna and the chip condenser as in the prior art, and it is possible to intend a reduction of space because such a space is not required for a circuit pattern for connecting individually the surface-mounted antenna and the chip condenser and to provide an inexpensive information device.

Moreover, in an assembled step of the parts of the surface-mounted antenna apparatus, a performance of the receiving circuit including the antenna assembly can be checked and therefore an assembling work can be smoothly carried out without requiring a time.

Furthermore, in the surface-mounted antenna apparatus 20 in the embodiment, even though the upper surface of the flange 24 and the upper surface of the flange 25 are the same level, since the synchronous chip condenser 27 is fitted completely within the concave portion 26 formed in the flange 24, a plurality of surface-mounted antenna apparatuses 20 can be disposed to align and be piled perpendicularly with respect to each other.

Figure 4:
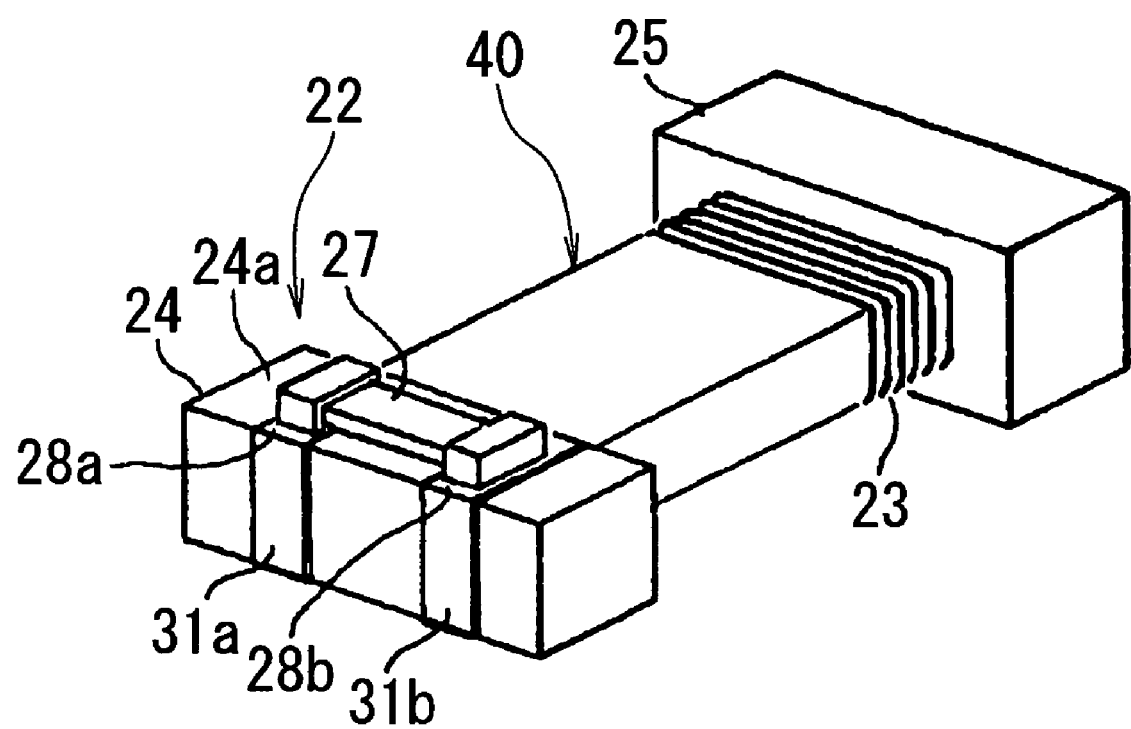
FIG. 4 is a perspective view showing a second embodiment of the surface-mounted antenna apparatus for receiving the standard frequency transmission, according to the present invention.

FIG. 4 illustrates a second embodiment of the surface-mounted antenna apparatus according to the present invention. In FIG. 4, the same reference numerals are affixed to the same parts as in the aforementioned embodiment illustrated in FIGS. 1 to 3.

In a surface-mounted antenna apparatus 40 illustrated in FIG. 4, the upper surface 24a of the flange 24 is configured generally to become lower than that of the other flange 25 by a height of the chip condenser 27 without providing the concave portion 26 in the one flange 24 of the surface-mounted antenna apparatus 20 for receiving the standard radio waves shown in FIGS. 1 to 3, the other structure is the same as in the surface-mounted antenna apparatus 20 shown in FIGS. 1 to 3.

When the condenser connecting electrodes 28a and 28b are disposed on the upper surface 24a of the one flange 24, which is lower than that of the other flange 25, because the upper surface of the flange 24 is generally lower than that of the other flange 25 by the height of the chip condenser 27, consequently, the upper surface of the other flange 25 and an upper surface of the chip condenser 27 become the same level.

The terminal leads (not shown in FIG. 4) of the coil 23 and chip condenser 27 are connected electrically with the condenser connecting electrodes 28a and 28b, similarly as in the embodiment in FIG. 1. In addition, the condenser connecting electrodes 28a and 28b extend through the intermediate electrodes 31a and 31b to the circuit connecting electrodes (not shown in FIG. 4) disposed on the lower surface of the flange 24 and the circuit connecting electrodes are connected electrically with the circuit pattern (not shown in FIG. 4) provided on the circuit substrate. On the lower surface of the other flange 25 is disposed the dummy electrode (not shown in FIG. 4) which in turn is connected electrically with the circuit pattern.

In the surface-mounted antenna apparatus 40 in the embodiment, because the upper surface 24a of the one flange 24, on which the condenser connecting electrodes 28a and 28b are disposed is flat, there is an advantageous effect that forming the condenser connecting electrodes 28a and 28b by printing or the like is easy. However, because it is not possible to align and pile the apparatuses 40 as in the apparatuses 20 shown in FIG. 1, and therefore it is not possible to adopt the piling method when stocking and mounting. Because the other advantages are the same as in the surface-mounted antenna apparatus 20 shown in FIG. 1, a repeat description thereof is omitted.

Figure 5:
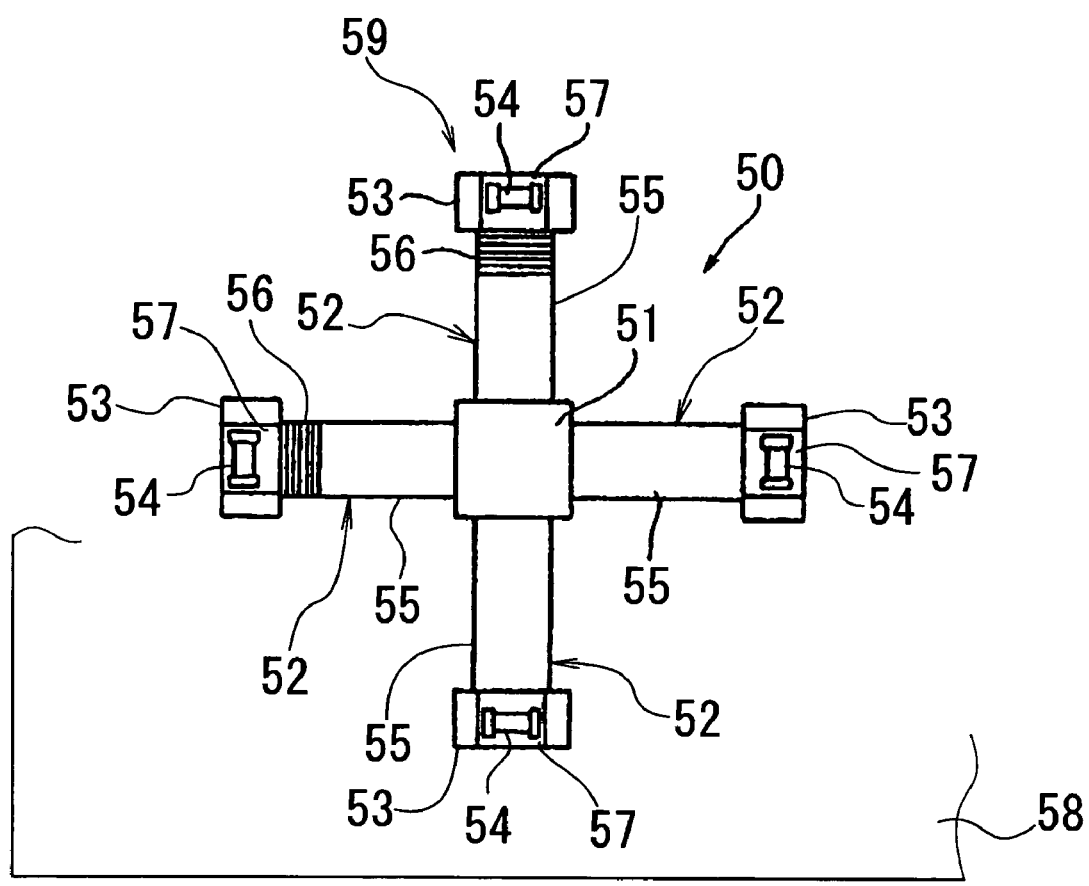
FIG. 5 is a top view showing a third embodiment of the surface-mounted antenna apparatus for receiving the standard frequency transmission, according to the present invention.

FIG. 5 illustrates a third embodiment of the surface-mounted antenna apparatus for receiving the standard radio waves according to the present invention.

A surface-mounted antenna apparatus 50 illustrated in the embodiment is formed in a cross shape in order to acquire a high sensibility of the antenna body. The antenna apparatus 50 comprises a base 51 and four antenna assemblies 52 extending crisscross from the base 51. Each of the antenna assemblies 52 has a flange 53 provided on an opposite end to the base 51. The surface-mounted antenna apparatus 50 in the embodiment comprises a combination in which four assemblies, each of which corresponds to the surface-mounted antenna assembly in FIG. 1 are connected in a cross shape. More specifically, the four surface-mounted antenna assemblies are connected to the base 51.

Accordingly, in the embodiment, the base 51 corresponds to the flange 25 as shown in FIG. 1 and each flange 53 corresponds to the flange 24 in the embodiment as shown in FIG. 1.

On the flange 53 of each antenna assembly 52 is disposed a chip condenser 54 similar to the chip condenser 27 as shown in FIG. 1. Each antenna assembly 52 comprises an elongated antenna body 55, a core (not shown) disposed within the antenna body 55 and a coil 56 wound on an outer periphery of the core by a predetermined number of turns.

A concave portion 57 is provided in an upper surface of each outside flange 53, similarly to the surface-mounted antenna apparatus 20 shown in FIG. 1 and the chip condenser 54 is disposed inside the concave portion 57.

Each of the outside flanges 53 in the surface-mounted antenna apparatus 50 is provided with various electrodes (not shown) similar as in the surface-mounted antenna apparatus 20 shown in FIGS. 1 to 3, through these electrodes, the terminal leads of the coil 56 and the chip condenser 54 are connected, and the surface-mounted antenna apparatus 50 and a circuit pattern (not shown) arranged on a circuit substrate 58 are electrically connected.

In the embodiment, the antenna apparatus 50 is mounted through circuit connecting electrodes (not shown) provided on a lower surface of each of the outside flanges 53 projecting in four directions, on the circuit substrate 58, it is not necessary to provide a dummy electrode as in the aforementioned embodiment, on a lower surface of the central base 51.

In the surface-mounted antenna apparatus 50, the coils 56 which are wound by the predetermined number of turns on the outer peripheries of the four cores (not shown) are configured integrally together, and the chip condenser 54 corresponding to each of the coils 56 is disposed in the concave portion 57 of the outside flange 53.

The variations in characteristics of the cores and the coils and the chip condensers are necessarily generated as well known and therefore there are also generated scatterings in the receiving circuits 59 composed of the antenna bodies including the cores and the coils, and the chip condensers in synchronization with the antenna bodies, so that differences in each antenna body are generated in the sensibility of the receiving circuit 59.

Consequently, in the embodiment, it is possible to configure a high sensitive receiving circuit 59 by adopting a combination of the coils 56 and chip condensers 54 for constituting the high sensitive receiving circuit 59, of the receiving circuits 59 configured by combination of two coils 56 which are disposed linearly and chip condensers 54.

At this time, the adopted coils for the receiving circuit 59 are selected from the two linearly arranged coils, which are mutually perpendicularly arranged. Accordingly, the high sensitive receiving circuit 59 can be formed in the surface-mounted antenna apparatus 50 in the embodiment, and because the coils are perpendicularly arranged with respect to each other, even if the directions of radio waves are changed pursuant to the posture of the mobile device, the directivity of the antenna body is presented from largely varying and therefore the standard radio waves can be received stably and with a high sensibility.

Alternatively, if the high sensitive receiving circuit 59 of the receiving circuits 59 for receiving radio waves having the same frequency is adopted, with a configuration capable of receiving the radio waves of two kinds of frequencies and with the change of the winding numbers of the two coils and a capacity of the chip condenser in the four coils, it is possible to obtain a surface-mounted antenna apparatus capable of receiving the radio waves of the two kinds of frequencies with the high sensibility.

Moreover, if all of the receiving circuits 59 are adopted, configuring to be capable of receiving radio waves of two kinds of frequencies, and changing the winding numbers of the two coils 56 which are linearly arranged and the capacity of each of the chip condensers 54, because radio waves of a first kind of frequency are received by the two coils which are perpendicularly arranged with respect to each other and radio waves of a second kind of frequency are received by the other two coils, pursuant to the posture of the mobile device, the directivity of the antenna body is presented from largely varying, simultaneously, the standard radio waves of two kinds of frequencies can be received.

If it is sufficient to receive only the standard radio waves of a particulate frequency (one kind), it is possible to provide a small surface-mounted antenna apparatus which has the same shape as described above, while, has coils of a generally half length by configuring as one antenna so as to dispose perpendicularly the linearly arranged coils, which are continuously wound. In this case, the synchronous chip condenser 54 are provided one by one with respect to the linearly arranged coils, as a result, totally, two chip condensers are disposed and it is preferably to provide dummy electrodes on lower surfaces of the outside flanges 53 on which the chip condensers are not provided and to fix the dummy electrodes on a not shown circuit pattern.

Figure 6:
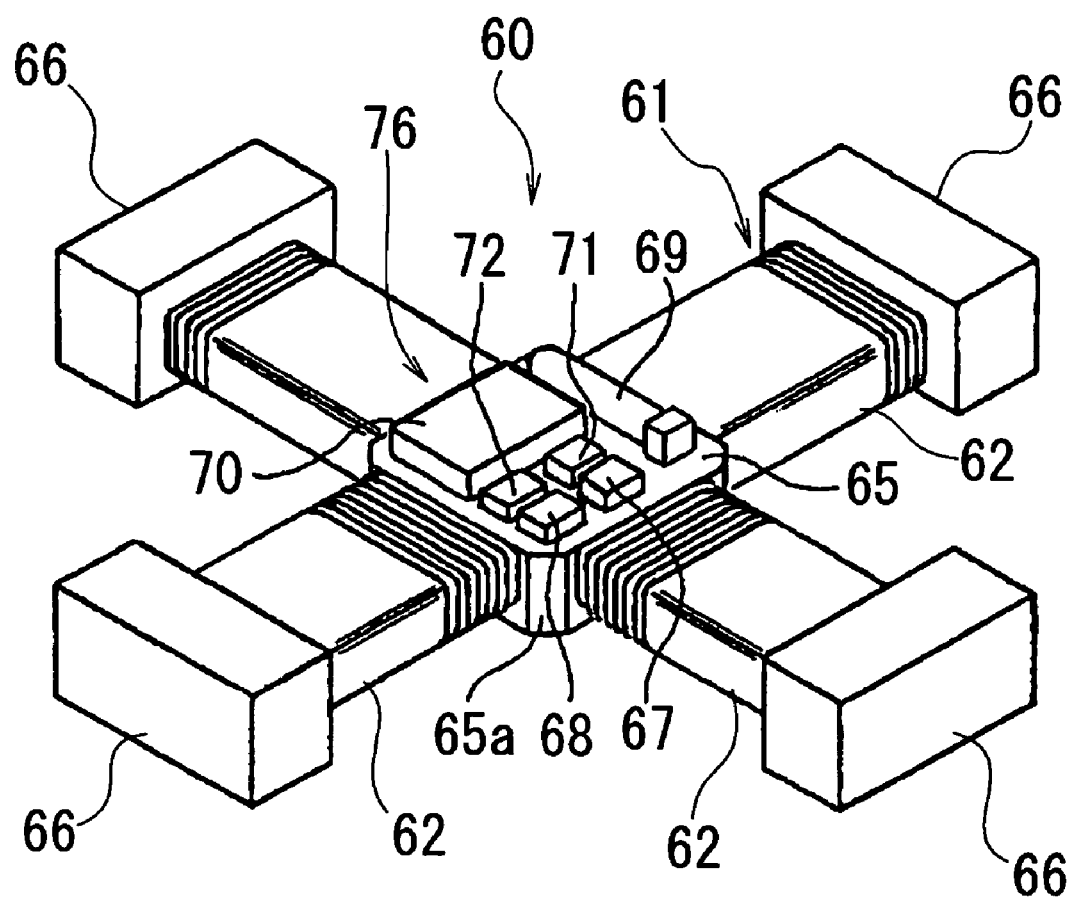
FIG. 6 is a perspective view showing a fourth embodiment of the surface-mounted antenna apparatus according to the present invention.
Figure 7:
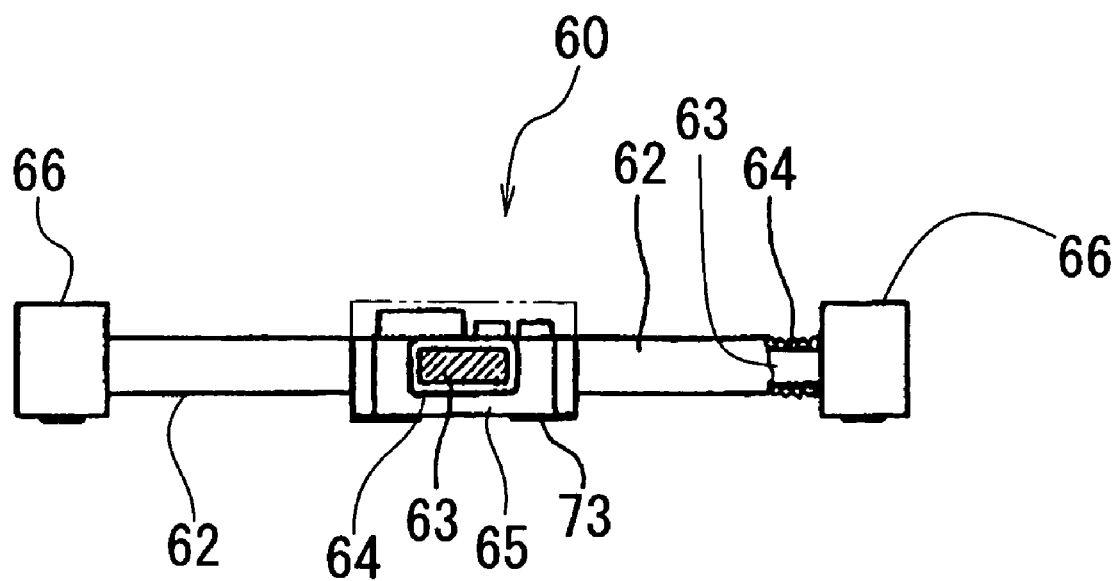
FIG. 7 is a partially sectional side view of the surface-mounted antenna apparatus as shown in FIG. 6.
Figure 8:
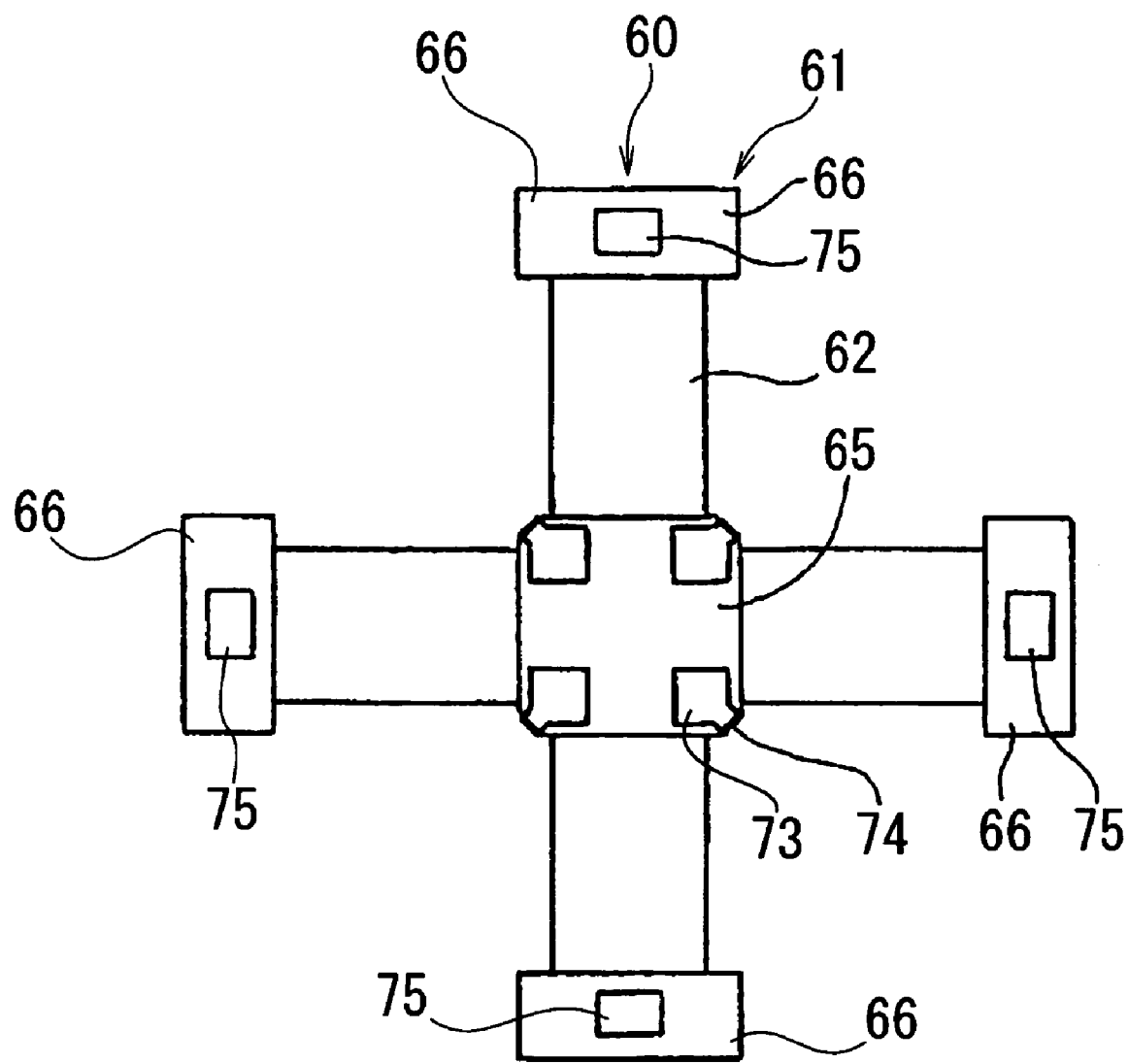
FIG. 8 is a bottom view of the surface-mounted antenna apparatus as shown in FIG. 6.

FIGS. 6 to 8 illustrate a four embodiment of the present invention.

A surface-mounted antenna apparatus 60 in the embodiment has four antenna assemblies 61 arranged in a cross shape. The antenna assemblies 61 comprise a surface-mounted type of multi directivity for receiving the standard radio waves. Each of the antenna assemblies 61 has an elongated antenna body 62, a ferrite core 63 disposed within the antenna body 62 and a coil 64 wound on a periphery of the core, as shown in FIG. 7. A base 65 is disposed in a central portion of the antenna assemblies 61. The four antenna bodies 62 are combined mutually through the base 65, and a flange 66 is provided at a leading end of each of the antenna bodies 62.

If the base 65 and flanges 66 all are formed into the same thickness, it is possible to stack stably one antenna assembly onto the other antenna assembly and stock them and then by taking out one by one the antenna assemblies from the stacked state, the taken-out antenna assembly can be mounted on a circuit substrate and therefore a space for the stock is not required.

However, in the embodiment, an upper surface of the base 65 disposed in the central portion of the antenna assemblies 61 is formed to become lower than the upper surfaces of the flanges 66 disposed at the leading ends of the antenna bodies 62, as clearly shown in FIG. 7 and a circuit pattern (not shown) is formed on the lowered upper surface of the base 65. On the circuit pattern, synchronous condensers 67 and 68 constituting a receiving circuit 76 in synchronization with the antenna bodies 62, a crystal oscillator 69 for generating a predetermined clock signal, an IC 70 for processing a receiving signal received by the antenna bodies 62, driving the aforementioned receiving circuit 76 and processing the clock signal acquired from the crystal oscillator 69 to correct a time by comparison of the clock and receiving signals, and condensers 71 and 72 are disposed.

Here, in the embodiment as shown in FIGS. 6 to 8, although the base 65 disposed in the central portion of the antenna assemblies 61 and the flanges 66 disposed at the leading ends of the antenna assemblies 61 are illustrated with the same size, if the size of the base 65 is too small to dispose the parts of the crystal oscillator 69, the IC and so on, the size of the base 65 may be extended to a necessary extent, while the size of the flanges 66 may be set to the minimum. In this case, the areas of the antenna assemblies 61 become large by an extent that the size of the base 65 is extended, but there is no any difference in intending a very little occupied space of the surface-mounted antenna apparatus as a whole, even if the antenna assemblies 61 become large, comparing with the type of mounting the parts of the crystal oscillator 69, the IC 70 and so on, on the circuit substrate of the information device, as in the prior art.

Moreover, in the embodiment, an upper surface of the base 65 is formed to become lower than that of each of the flanges 66 disposed at leading ends of the antenna bodies 62, and on the lowered upper surface of the base 65 is formed a circuit pattern on which the parts of the crystal oscillator 69, the IC 70 and so on are mounted, while as long as the height of each of the parts of the crystal oscillator 69, the IC 70 and so on, which are arranged on the base 65 is set to become lower than that of each of the flanges 66, there are no particular problems, because it is possible to stack stably and stock the surface-mounted antenna apparatuses only by the flanges 66 disposed at the leading ends of the antenna bodies 62 when the antenna assemblies 61 are mounted on the circuit substrate. Alternatively, after the parts of the crystal oscillator 69, the IC 70 and so on are mounted on the circuit pattern on the base 65, they may be molded so as to have the same height as the flanges 66, as shown by imaginary lines in FIG. 7.

In the antenna assemblies 61 in the embodiment, provided on a lower surface of the base 65 are electrodes 73 for connecting with the circuit substrate on which the antenna assemblies are mounted, and connecting conductors 74 (see FIG. 8) for connecting the circuit pattern formed on the base 65 and the electrodes 73 are provided on side surfaces of chamfered portions 65a (see FIG. 6) formed in the base 65. The electrodes 73 are not limited to four numbers as shown, and any numbers may be provided, necessary to satisfy the connection of the circuit pattern of the antenna assemblies 61 and the circuit pattern of the circuit substrate. In addition, the chamfered portions 65a are formed widely in width so as to be capable of forming easily the connecting conductors 74, while they are not required, if side surfaces of the base 65 have widths sufficient to form the connecting conductors 74 on the side surfaces, as in a case that the antenna assemblies are enlarged.

Electrodes 75 for fixing the antenna assemblies 61 to the circuit substrate are disposed on lower surfaces of the flanges 66 in the antenna assemblies 61. The electrodes 75 for fixing secure the antenna assemblies 61 to the circuit substrate in cooperation with the electrodes 73. In the embodiment, although the electrodes 75 for fixing are configured to be soldered simultaneously with the electrodes 73, the connection is not limited to soldering, for example, any fixing means such as an adhesive may be used.

The surface-mounted antenna apparatus 60 for a wave clock in the embodiment is configured as described above, and therefore parts necessary as a clock apparatus for receiving standard radio waves for correcting a time and for correcting automatically a time of a clock contained in the clock apparatus are all disposed on the base 65 in the antenna assemblies 61, as a result, the antenna apparatus 60 can be applied easily to the clock apparatus for the wave clock only by mounting the antenna apparatus on the circuit substrate. Furthermore, because only the antenna apparatus 60 may be mounted on the circuit substrate, it is possible to more miniaturize the clock apparatus for the wave clock as a whole to make a little occupied space and to accomplish a considerable reduction of cost as a whole including a mounted process.

Figure 9:
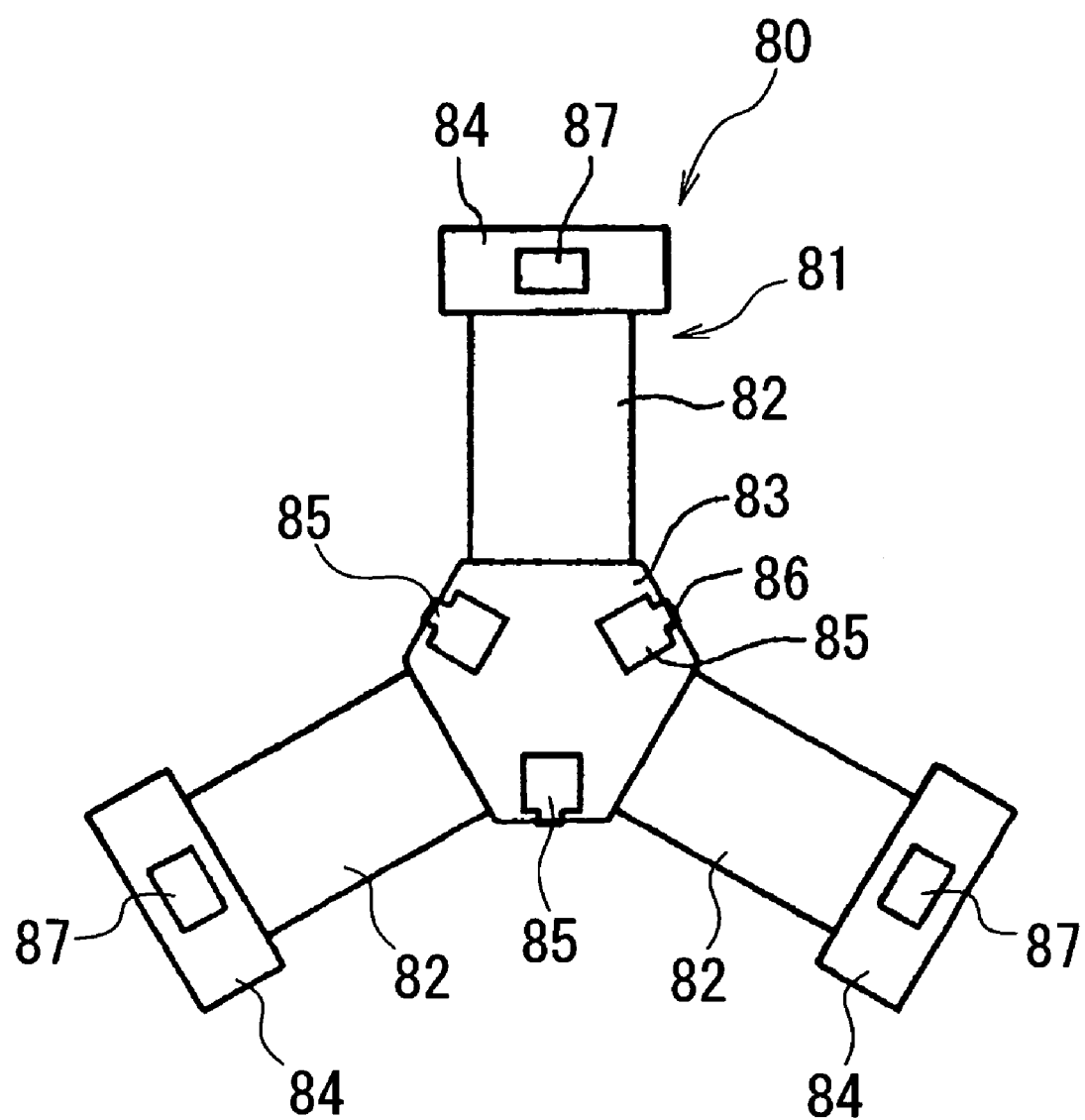
FIG. 9 is a sectional view showing a fifth embodiment of the surface-mounted antenna apparatus according to the present invention.
Figure 10:
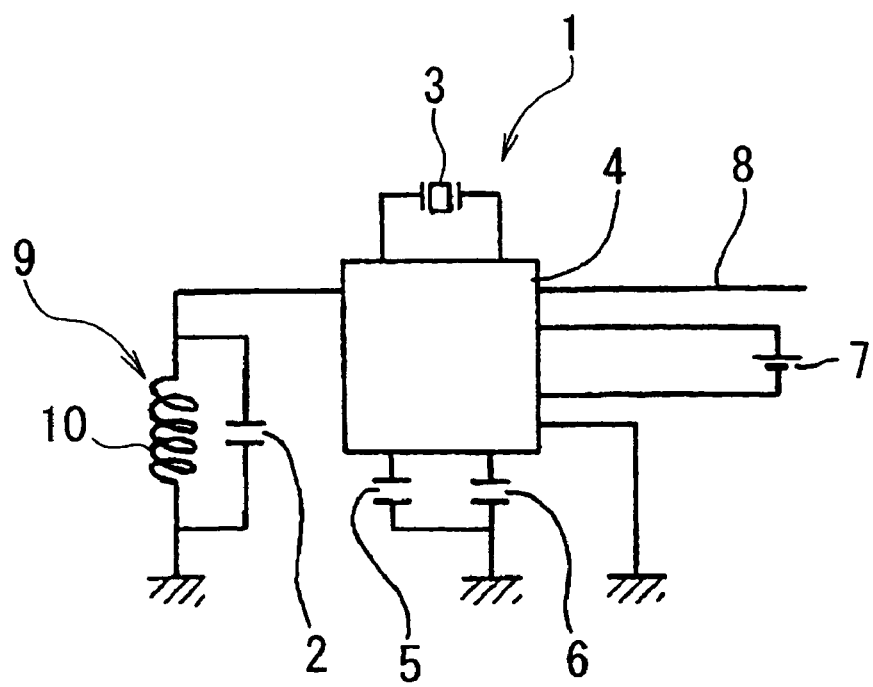
FIG. 10 is a circuit view showing one example of a circuit in a conventional clock device for a wave clock.
Figure 11:
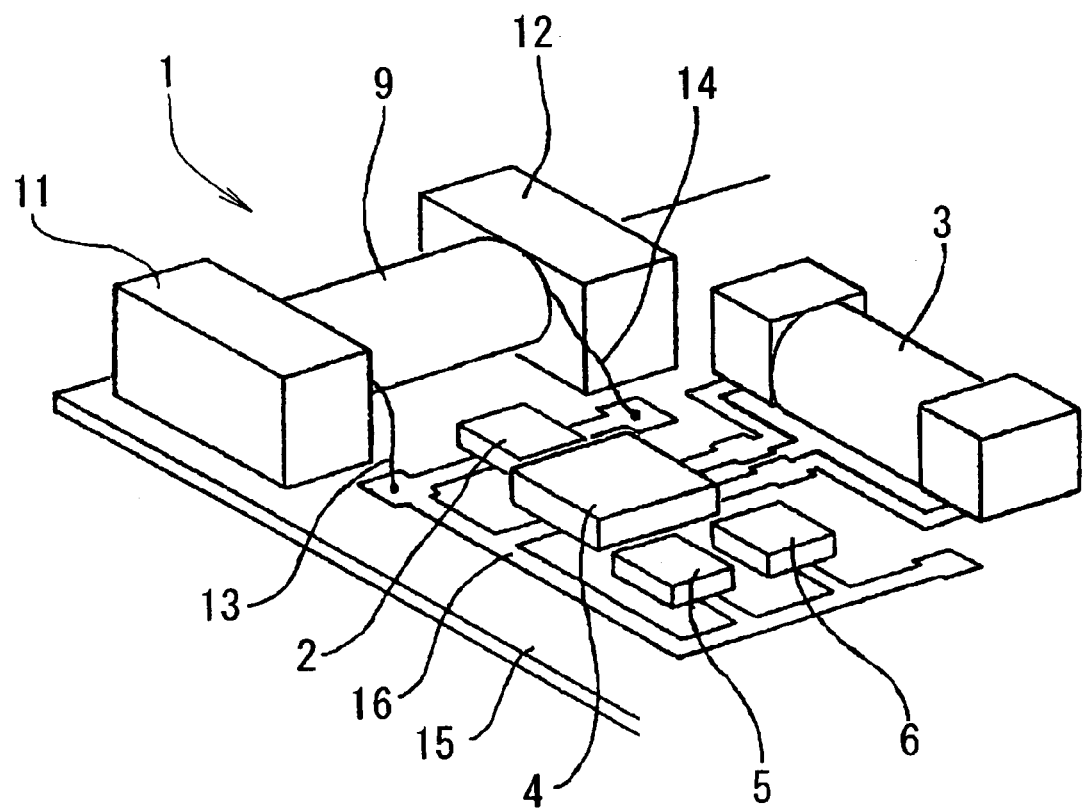
FIG. 11 is a perspective view showing one example of a circuit structure in which parts are actually mounted, in a conventional clock device for a wave clock.

FIG. 9 illustrates a fifth embodiment of the present invention. A surface-mounted antenna apparatus 80 for a surface-mounted wave clock for receiving standard radio wave in the embodiment includes antenna assemblies 81 which are projected in three directions. Each of the antenna assemblies 81 has an elongated antenna body 82, similar to these in the aforementioned embodiments. The antenna bodies 82 are combined by means of a base 83 disposed in a central portion of the antenna assemblies. An upper surface of the base 83 is set to become lower than that of a flange 84 disposed at a leading end of each of the antenna bodies 82, similarly as in the embodiment as shown in FIGS. 6 to 8, and a circuit pattern (not shown) is formed on the lowered upper surface of the base 83. On the circuit pattern, synchronous condensers (not shown) constituting a receiving circuit (not shown) in synchronization with the antenna bodies 82, a crystal oscillator (not shown) for generating a predetermined clock signal, an IC (not shown) for processing a receiving signal received by the antenna bodies 82, driving the aforementioned receiving circuit and processing the clock signal acquired from the crystal oscillator to correct a time by comparison of the clock and receiving signals, and condensers (not shown) for the IC are disposed.

In the antenna assemblies 81 in the embodiment, electrodes 85 for connecting with a circuit substrate mounting the antenna assemblies 81 thereon are provided on a lower surface of the base 83, as shown in FIG. 9. Side surfaces of the base 83 are provided with connecting conductors 86 for connecting a circuit pattern formed on the upper surface of the base 83 and the electrodes 85. In addition, fixing electrodes 87 for fixing the antenna assemblies 81 to the circuit substrate are disposed on lower surfaces of the flanges 84 in the antenna assemblies 81.

Because the antenna apparatus 80 for the wave clock in the embodiment is configured as described above, parts necessary as a clock apparatus for receiving standard radio waves for correcting a time and for correcting automatically a time of a clock contained in the clock apparatus are all disposed on the base 83 in the antenna assemblies 81, as a result, the antenna apparatus 80 can be used in the clock apparatus for the wave clock only by mounting the antenna apparatus 80 for the wave clock on the circuit substrate, similarly as in the embodiment shown in FIGS. 6 to 8. Furthermore, because only the antenna apparatus 80 may be mounted on the circuit substrate, it is possible to more miniaturize the clock apparatus for the wave clock as a whole and to make a little occupied space and to accomplish a considerable reduction of cost as a whole including a mounted process.

In the embodiment, the surface-mounted antenna apparatus for receiving the standard radio waves, having the multi-directivity can be accomplished, as described above.

With the structure as described above, the surface-mounted antenna apparatus can be applied efficiently to an instrument such as a television, a radio and a mobile phone, and a watch which are requested to miniaturize. More specifically, if the surface-mounted antenna apparatus according to the present invention is applied to the television, the radio, the mobile phone, the watch and so on, all the parts necessary to the antenna apparatus can be disposed at one place, that is to say, the one flange or base and therefore the radio waves can be received only by the antenna apparatus on the circuit substrate merely, consequently, the assembly for the antenna apparatus is very simple.

Moreover, the antenna body or antenna bodies and the chip condenser or the chip condensers can be assembled with one process. The antenna apparatus assembled in this way is can be installed within the television, the radio, the mobile phone and the clock apparatus for the wave clock and so on, only by mounting the antenna apparatus on the circuit substrate merely as described above, accordingly, the structure and the work for assembling and mounting are very easy and therefore an inexpensive antenna apparatus can be provided.

Furthermore, because the surface-mounted antenna apparatus can be very miniaturized, particularly, thinned possibly, it is possible to provide a surface-mounted antenna apparatus in which for example, the clock apparatus for the wave clock, the mobile phone and so on are more miniaturized as a whole and a little occupied space can be made.

In addition, it is possible to provide a surface-mounted antenna apparatus capable of inspecting a performance of the receiving circuit including the surface-mounted antenna assembly or assemblies, at the step of parts.

What is claimed is:

1. A surface-mounted antenna apparatus comprising:
   a receiving circuit provided on a circuit substrate and having receiving parts; and
   at least one antenna body which is surface-mounted on said circuit substrate,
   wherein at least one portion of said receiving parts in said receiving circuit and connecting electrodes for connecting said one portion of the receiving parts with said receiving circuit are installed on said antenna body, wherein the one portion of the receiving parts in the receiving circuit has a coil attached to said antenna body and a chip condenser attached to said antenna body, and wherein said connecting electrodes are provided on said antenna body and connected electrically with said coil and said chip condenser.

2. A surface-mounted antenna apparatus which is surface-mounted on a circuit substrate having a receiving circuit, comprising:

at least one antenna body including a coil which has leads;

a flange provided on at least one end of said antenna body;

a chip condenser attached to said flange;

condenser connecting electrodes provided on one surface of said flange to be connected with said leads of the coil and said chip condenser; and circuit connecting electrodes provided on another surface of said flange to be connected with said condenser connecting electrodes and said receiving circuit of the circuit substrate.

3. The surface-mounted antenna apparatus according to claim 2, wherein said condenser and circuit connecting electrodes are integrally formed.

4. The surface-mounted antenna apparatus according to claim 2, further comprising a concave portion formed in an upper surface of said flange, wherein said condenser connecting electrodes are inserted into said concave portion.

5. The surface-mounted antenna apparatus according to claim 3, further comprising flanges provided on opposite ends of said antenna body, wherein an upper surface of one flange is formed to become lower than that of another flange, said condenser connecting electrodes being disposed on the lowered upper surface of the one flange.

6. The surface-mounted antenna apparatus according to claim 2, wherein said condenser connecting electrodes are attached on an upper surface of said flange, wherein said circuit connecting electrodes for connecting with a circuit pattern provided on the circuit substrate and connected with the receiving circuit are attached on a lower surface of said flange, and wherein intermediate electrodes for connecting with said condenser and said circuit connecting electrodes are provided on a side surface of the flange.

7. The surface-mounted antenna apparatus according to claim 5, further comprising a dummy electrode provided on a lower surface of the another flange.

8. A surface-mounted antenna apparatus surface-mounted on a circuit substrate and having multi-directivity for receiving radio waves, comprising:

a base;

a plurality of antenna bodies extending in a plurality of directions from said base;

a circuit for receiving the radio waves, formed on an upper surface of said base; and electrodes provided on a lower surface of said base to be connected with said receiving circuit and said circuit substrate.

9. The surface-mounted antenna apparatus according to claim 8, further comprising connecting conductors provided on a side surface of said base for connecting said receiving circuit and said electrodes.

10. The surface-mounted antenna apparatus according to claim 8, wherein said receiving circuit includes a synchronous condenser constituting the receiving circuit together with said antenna bodies, a quartz crystal oscillator for generating a predetermined clock signal, an IC for processing a received signal received by said antenna bodies by driving said receiving circuit and for correcting a time by processing said clock signal obtained from the quartz crystal oscillator and comparing said clock signal and said received signal and a condenser for said IC.

11. The surface-mounted antenna apparatus according to claim 8, further comprising flanges provided on ends of said plurality of antenna bodies opposite to said base, wherein the upper surface of the base is formed to become lower than that of said flanges.

12. The surface-mounted antenna apparatus according to claim 8, wherein said plurality of antenna bodies are disposed in a cross shape.

13. The surface-mounted antenna apparatus according to claim 8, wherein said plurality of antenna bodies are configured to extend in three directions.

14. The surface-mounted antenna apparatus according to claim 8, further comprising electrodes provided on a lower surface of said flange for mounting said antenna apparatus on said circuit substrate.

* * * * *